Oct. 14, 1958

D. E. SUNSTEIN 2,856,521

AUTODYNE FREQUENCY CONVERTER WITH SELF-BIAS CONTROLLED AMPLITUDE LIMITING AND PRECLUSION OF GRID CURRENT FLOW

Filed Oct. 18, 1954

2 Sheets-Sheet 1

INVENTOR.
DAVID E. SUNSTEIN

BY Brown, Denk & Lynnestvedt

AGENTS

Oct. 14, 1958 D. E. SUNSTEIN 2,856,521

AUTODYNE FREQUENCY CONVERTER WITH SELF-BIAS CONTROLLED AMPLITUDE LIMITING AND PRECLUSION OF GRID CURRENT FLOW

Filed Oct. 18, 1954

2 Sheets-Sheet 2

INVENTOR.
DAVID E. SUNSTEIN

BY

Brown, Denk & Synnestvedt

AGENTS

United States Patent Office 2,856,521

Patented Oct. 14, 1958

2,856,521

AUTODYNE FREQUENCY CONVERTER WITH SELF-BIAS CONTROLLED AMPLITUDE LIMITING AND PRECLUSION OF GRID CURRENT FLOW

David E. Sunstein, Bala-Cynwyd, Pa., assignor to Philco Corporation, Philadelphia, Pa., a corporation of Pennsylvania Application October 18, 1954, Serial No. 462,803

4 Claims. (Cl. 250—20)

The invention herein described and claimed relates to frequency conversion systems and circuits. More particularly the instant invention appertains to an improved frequency converter of the autodyne type. Such converters are adapted for service, for example, in radio receivers employing the superheterodyne type of circuit.

The autodyne frequency converter, in its most characteristic form, and as it was known prior to the present invention, comprises an oscillator, to the control grid of which the radio frequency signal is applied, and from which converter an intermediate frequency wave is derived which is a resultant of the heterodyning of the radio frequency signal and the locally generated oscillation. A typical example of the prior art form of the device is described and illustrated on pages 102 and 107 of the "Radiotron Designer's Handbook," third edition, 1940, published by The Wireless Press, Sydney, Australia.

The autodyne frequency converter was widely employed in radio receivers during the period 1931 to 1936, but it was subject to a number of serious limitations. First, because of the loading of the R.-F. input circuit by the high grid-circuit conductance of the tube, the conversion gain of the device was much lower than might otherwise have been expected. Second, it was not practical to apply an automatic gain control (AGC) voltage to the autodyne because of its deleterious effect on oscillator signal amplitude. Where an AGC voltage was applied to the conventional autodyne only a relatively slight variation in gain was obtained because of the counteracting effect of the oscillator function which acts automatically to drive the tube up to or beyond zero grid bias on the peaks of conduction, and causes excursion of the grid characteristic over substantially its full range. Thus conversion gain is hardly affected by moderate values of AGC voltage. If too great an AGC voltage is applied a point is reached at which oscillations cease altogether. This results in a condition known as "squegging" or "motor boating."

Consequently, when the later-developed pentagrid converter made its commercial appearance the autodyne frequency converter was used less frequently and was finally generally abandoned, even though the pentagrid converter did not provide the high conversion gain and circuit economies of which the autodyne device was theoretically capable.

It is, accordingly, a principal object of the present invention to provide an improved autodyne frequency converter which avoids the limitations of the conventional autodyne and which achieves the full advantages of which the autodyne is theoretically capable.

It is a further object of the invention to provide a frequency converter of the autodyne type to which an automatic gain control voltage may usefully and effectively be applied.

It is another object of the invention to provide an autodyne frequency converter having automatic amplitude control of the locally generated oscillation.

It is still another object of the invention to provide an autodyne frequency converter having, in operation, a greatly reduced grid-circuit conductance.

To the foregoing general ends, it is a feature of the present invention to provide an improved autodyne frequency converter comprising a vacuum tube having at least a cathode, a control grid, and an anode, an oscillatory circuit, said oscillatory circuit being connected in both the grid-cathode and anode-cathode circuits of said tube to generate a local oscillation, means external to said grid-cathode circuit for controlling the amplitude of said local oscillation, means for applying a signal-frequency wave to said grid-cathode circuit, and means responsive to the heterodyning of said local oscillation and said signal frequency wave for deriving a beat frequency signal therefrom.

These and other objects and features of the invention, and the manner in which they are attained, will appear from the following detailed description, in which—

Figure 1:
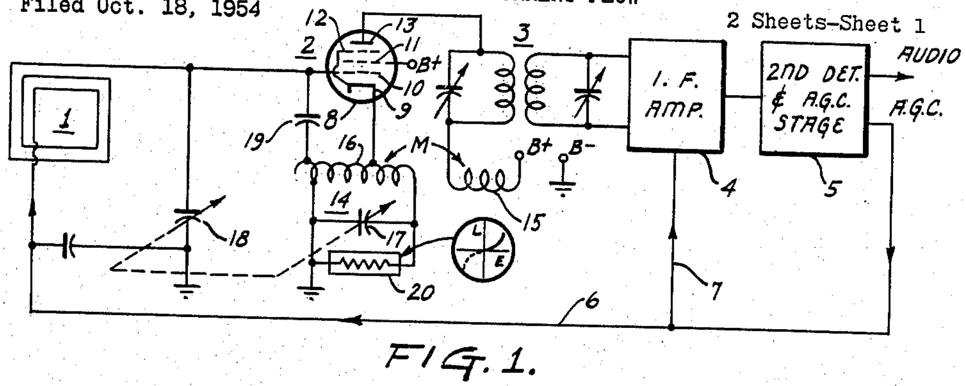
Fig. 1 is a generalized schematic diagram illustrating the basic principles underlying the invention.

Reference may now be had to Fig. 1 in which there is shown a radio receiver embodying the improved autodyne frequency converter of the present invention. In this figure the invention has been shown in somewhat generalized form in order to facilitate the preliminary description and understanding thereof. The radio receiver there illustrated is comprised generally of a loop antenna 1, an autodyne frequency converter stage 2, an intermediate frequency coupling transformer 3, an intermediate frequency amplifier 4, and a combined second detector and automatic gain control stage 5. The AGC voltage developed in stage 5 may be applied to the control grid of the autodyne frequency converter by way of the AGC bus 6 and the loop antenna 1, and to the intermediate frequency amplifier 4 by way of the conductor 7.

The tube 8 employed in the autodyne device 2 is comprised of at least triode elements, but is preferably of the pentode variety comprising a cathode 9, a control grid 10, a screen grid 11, a suppressor grid 12, and an anode 13.

The oscillator section of the autodyne frequency converter comprises the oscillatory circuit 14 in combination with the grid-cathode and anode-cathode circuits of the pentode 8. It will be observed that a portion of the oscillatory circuit 14 is connected directly in the grid-cathode circuit of the pentode, coupling to the anode-cathode circuit of the pentode being by way of the tickler coil 15. The oscillatory circuit 14 is comprised of the inductor 16 and the variable tuning capacitor 17. The latter is ordinarily ganged with the loop antenna tuning capacitor 18, as indicated.

The radio frequency signal presented by the tuned loop antenna circuit 1, 18, is applied to the control grid 10. It will be noted that the control grid 10 is common to both the R.-F. signal input section of the tube 8 and the oscillator section thereof. The oscillator section of the tube functions, however, with the grid 10 effectively at ground potential for signals of oscillator frequency, the loop antenna circuit having negligible impedance at these frequencies. Normally, however, a finite voltage of oscillator frequency will tend to be developed on the grid 10 and this is preferably prevented, or minimized, by the provision of a neutralizing capacitor 19 connected between the said control grid and an appropriate point on the oscillator tank circuit. Neutralization also functions to prevent the detuning (or "drag") effect on the oscillator of the reactance of the tuned grid circuit 1, 18.

When an AGC voltage is applied to the signal grid of an autodyne converter the $g_m$ of that tube will vary over a wide range and therefore the oscillator circuit losses must be made low enough to ensure oscillation at the lowest $g_m$ (i. e. at the maximum AGC voltage) which obtains in practice.

As thus far described the circuit arrangement of Fig. 1 is representative of the autodyne frequency converters of the prior art, except that the automatic gain control connection was ordinarily omitted for the reason that such control was generally ineffective. Where an AGC voltage was applied to the conventional autodyne only a slight variation in receiver gain was obtained because of the counteracting effect of the oscillator which acted to continue to drive the tube up to zero grid bias on the peaks of conduction, regardless of the AGC voltage applied to the control grid.

In the past the operation of the oscillator was controlled, and the oscillator amplitude limited to some extent, by the provision of a grid-leak-grid-condenser combination which caused the grid to bias itself more negatively with increased oscillation amplitude. This, however, also caused grid current to be drawn, which, in turn, loaded the R.-F. input circuit and reduced the amount of R.-F. signal which could be applied to the grid from the antenna.

In consequence of the foregoing, the conventional practice, with respect to receivers employing autodyne frequency converters, was to avoid the complexities introduced by the application of an AGC voltage to the autodyne and to rely entirely on the application of the AGC voltage to the I.-F. stages and to the R.-F. stage, if any. However, it is imperative in most practical applications, to apply an AGC voltage to the signal grid of the converter stage if a satisfactory overall AGC characteristic is to be secured.

By the present invention there is provided automatic means, external to the oscillator circuit per se, for controlling, or limiting, the amplitude of the local oscillation and thus to prevent the aforesaid tendency of the oscillator to counteract the desired effect of the AGC voltage, and, further, to prevent the aforementioned loading of the R.-F. input circuit.

In the embodiment of Fig. 1 the automatic oscillator amplitude control device is represented by the generalized showing of a non-linear impedance means 20 connected in shunt with the oscillatory circuit 14. The device 20 may have a current vs. voltage characteristic of the type illustrated in the circled graph adjacent the schematic representation of the device 20. In practice the device 20 may comprise a resistor having a negative temperature coefficient of resistance (such as a carbon-filament lamp, a Thyrite circuit element, or the like), or it may comprise a suitable back-biased diode limiter. In general, however, the device should offer a relatively high resistive impedance at low oscillator amplitudes, and a decreasing resistance at higher oscillator amplitudes, the effect being to increasingly load the oscillatory circuit as the voltage thereacross increases. The overall effect of the presence of such a device is, of course, to maintain the voltage thereacross within predetermined limits and thereby to prevent the flow of grid current. This it does by controlling the amount of feedback provided around the pentode rather than by attempting to lower the transconductance of the tube as the amplitude of the oscillator signal increases. When this approach is used, the further benefit is achieved that an AGC voltage may be applied to the tube to lower its transconductance while at the same time permitting full strength oscillation, or very nearly full strength oscillation, over a very wide range of AGC voltages.

Figure 2:
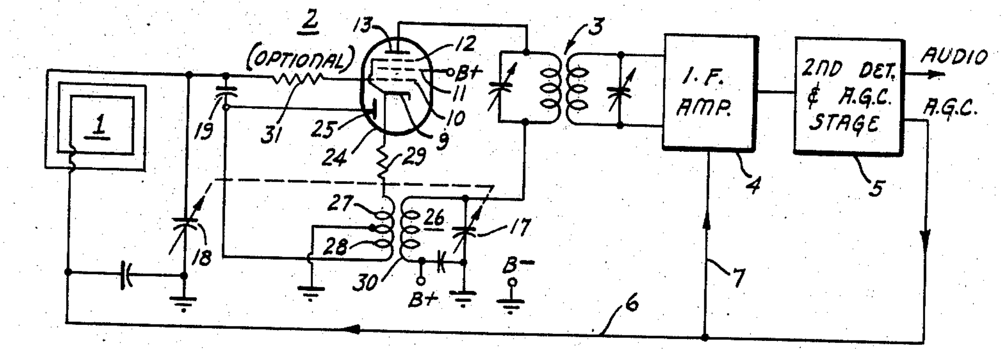
Fig. 2 is a schematic diagram of a preferred embodiment of the invention.

A more specific, and a preferred, embodiment of the invention is illustrated in Fig. 2, to which reference may now be had. Many of the circuit components illustrated in Fig. 2, and in the suceeding figures, correspond to circuit components already described with reference to Fig. 1 and they, of course, bear like reference characters.

In the arrangement of Fig. 2, a back-biased diode is employed as the automatic oscillator amplitude limiting means, and to this end there is provided a diode-pentode tube 24 employing the usual pentode elements together with a diode anode 25 cooperating with the common cathode 9. Alternatively, of course, separate cathodes may be provided or separate pentode and diode tubes may be employed. The oscillator circuit differs somewhat from that illustrated in Fig. 1 in that its tank circuit 26 is directly connected in the anode circuit of the pentode, it being coupled to the signal grid circuit of the pentode inductively by way of the coupled cathode winding 27. The neutralizing capacitor 19 is connected between the control grid 10 and the lower end of a neutralizing winding 28. As with the arrangement of Fig. 1, the effect of the neutralizing capacitor 19 is to neutralize the oscillator voltage which is impressed on the control grid 10 by way of the interelectrode capacitance existing between cathode 9 and grid 10.

Automatic control of the amplitude of oscillation is provided by the diode 25 which is coupled in shunt with the oscillatory circuit 26 through the agency of the inductively coupled windings 27 and 28. The diode is biased to be non-conductive at low applied voltages through the provision of the series cathode resistor 29 which biases the diode anode 25 negatively with respect to its cathode 9. However as the amplitude of oscillations increases, the diode 25 is rendered conductive and becomes an increasingly greater load on the oscillator. By proper choice of bias voltage (as determined by the resistor 29), and of turns ratio, taking into account the relative perveance of the diode as contrasted to the perveance of the pentode (looking into the cathode of the pentode), a stable amplitude of oscillation is achieved in which the cathode 9 never falls below ground potential. Under these circumstances the grid 10 will never draw current. Preferably the diode 25 has a relatively high perveance, for example of the order of that provided by a 6AL5 diode.

It should be noted that the cathode bias resistor 29 performs a dual function. In addition to that already noted, the voltage developed thereacross biases grid 10 negatively with respect to cathode 9 and precludes the flow of grid current under weak signal conditions i. e. under conditions of zero or very low AGC voltage.

It will be observed that, unlike in the circuit arrangements later to be described with reference to Figs. 3 and 4, the cathode resistor 29 has not been provided with a capacitive R.-F. bypass. Where a sharp cutoff pentode is employed in the autodyne stage the omission of the bypass capacitor decreases the modulation envelope distortion which tends to occur on strong R.-F. signals of 0.5 volt or more. Where a remote cutoff pentode is employed—and this is preferred—an R.-F. bypass capacitor may be provided in shunt with cathode resistor 29 without the introduction of distortion and with a resultant increase in stage gain.

In certain embodiments of the invention it was found that there was a tendency for parasitic oscillations to exist. Where this was encountered it could be eliminated by the provision of a resistor 31 connected in series between the loop antenna 1 and the control grid 10 of the autodyne 2.

In one physical embodiment of the circuit arrangement of Fig. 2, the following values of certain of the key components were employed. Oscillator tank circuit inductor 30, 143 μh.; inductor 27—28, 60 turns, center tapped, 25.8 μh. total; coefficient of coupling between winding 27—28 and winding 30, 0.55 or higher; neutralizing capacitor 19, 4.7 mmf.; cathode resistor 29, 330 ohms; the series grid resistor 31, which may be of the order of 10,000 ohms, was found to be unnecessary in this particular application; the pentode employed was a 6BA6 and diode was one element of a 6AL5.

It was found that the coefficient of coupling between the tank inductor 30 and the winding 27—28 had an effect on the tendency of the AGC voltage to "drag" the frequency of the oscillator signal. When the coefficient of coupling was 0.84 the "drag" was relatively small, while with a coefficient coupling of 0.94 the "drag" was also small but of reversed sign. At coefficients of coupling between these values the "drag" effect was negligible.

In designing the receiver's AGC system care should be taken that the control grid is never driven so negative by AGC voltage that the diode 25 stops conducting. This will insure an adequate safety factor so that oscillation will never cease on strong signals. In a receiver constructed in accordance with the principles of the present invention, application of AGC voltage to the control grid of the pentode will reduce the magnitude of the oscillator frequency component of plate current in the pentode and this in turn will be compensated for by an automatic reduction in the diode current, the result being that the transconductance of the pentode can be lowered appreciably without altering the amplitude of oscillations significantly. In fact, the amplitude of the oscillation does not start to diminish noticeably so long as there is enough transconductance left in the pentode to insure that some current is drawn by the diode.

It is significant to note that applicant's autodyne converter circuit employs no grid-leak-grid-condenser combination, and that the amplitude of the generated oscillations are controlled entirely by means external to the oscillator per se.

Figure 3:
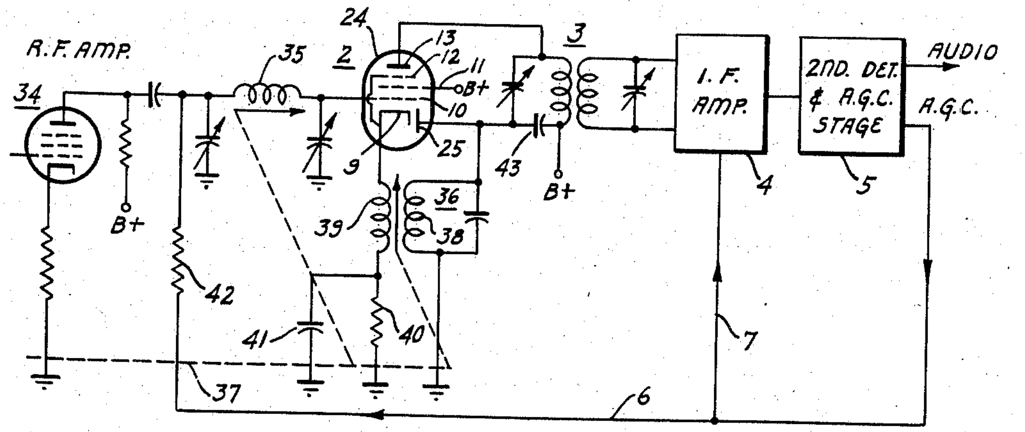
Fig. 3 is a schematic diagram of an alternative embodiment of the invention.

Reference may now be had to Fig. 3 in which there is illustrated an alternative embodiment of the improved autodyne circuit of the present invention, and one which is particularly adapted for use with receivers which are permeability tuned. In this embodiment of the invention the coupling circuit between the R.-F. amplifier stage 34 and the autodyne frequency converter stage 2 is tuned by means of the permeability-tuned inductor 35 in a manner well understood in the art. Similarly the oscillator tank circuit 36 is permeability tuned and the tuning elements are ganged together by a mechanical apparatus 37 well known in the art. The permeability-tuned antenna stage (not shown) may be ganged to the same device.

In the oscillator circuit employed in Fig. 3 the oscillatory circuit 36 and the tuned primary circuit of the intermediate frequency transformer 3 are connected in series between the anode 13 of the tube 24 and ground. Anode voltage is applied to the tube by way of a connection to the lower end of the primary winding of the transformer. The capacitor 43, which may be of the order of 20 $\mu\mu$f., is used to isolate the oscillator tank 36, and the amplitude control diode 25, from B+.

Oscillator feedback is by way of the coupling between the oscillator tank coil 38 and the cathode circuit feedback coil 39. In this arrangement the automatic amplitude-control diode 25 is effectively across the combination of the tank circuit 36 and cathode feedback winding 39. The cathode bias resistor 40 provides an initial voltage delay for the diode 25 similar to that provided by the resistor 29 of Fig. 2. The resistor 40 is bypassed by the capacitor 41, experience with this circuit showing that the degenerative effect, noted with reference to the un-bypassed resistor 29 of Fig. 2, was unnecessary. Where the bypass capacitor is provided somewhat increased converter stage gain results.

AGC voltage from the AGC stage 5 is applied to the signal grid of the autodyne converter stage by way of AGC bus 6 and the series isolating resistor 42. The latter may be of the order of 70,000 ohms.

In constructing the inductively coupled windings 38—39, a design should be selected which maintains the effective voltage stepdown from anode winding 38 to cathode winding 39 substantially independent of tuning core position. This may be accomplished by winding the coil 39 directly over the winding 38 and generally coextensive therewith, rather than at one end thereof.

Figure 4:
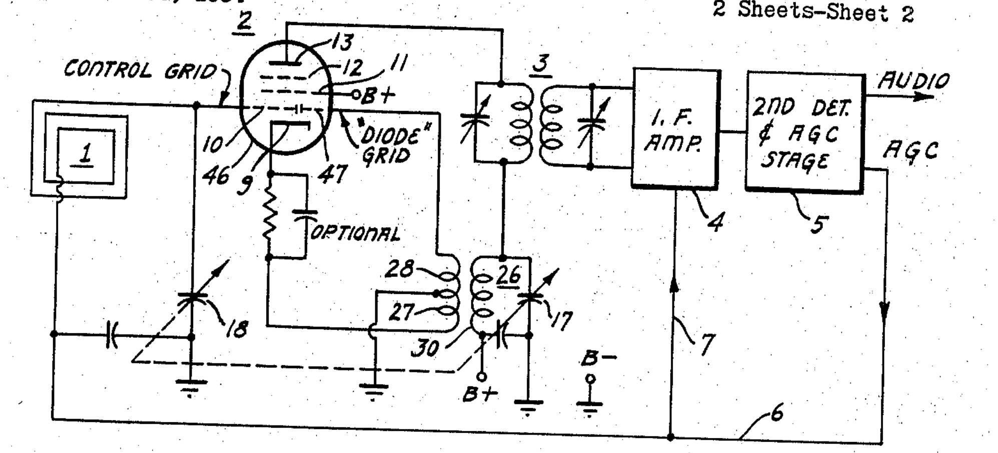
Fig. 4 is a schematic diagram of still another embodiment of the invention.

Attention is now directed to the embodiment of Fig. 4, an arrangement which is schematically similar to that illustrated in Fig. 2, but which requires a special form of converter tube 46. This tube embodies, in place of the diode element 25 of Fig. 2, an additional grid-like element 47 which, because it functions also as a diode, may be referred to as a diode grid. In the construction of the tube, the control grid 10 preferably confronts more than half the area of the cathode 9, while the diode grid 47 confronts less than half the cathode. The grids 10 and 47 are electrically distinct but may be wound on the same, or substantially the same, radius with respect to the cathode or filament surface.

Figure 5:
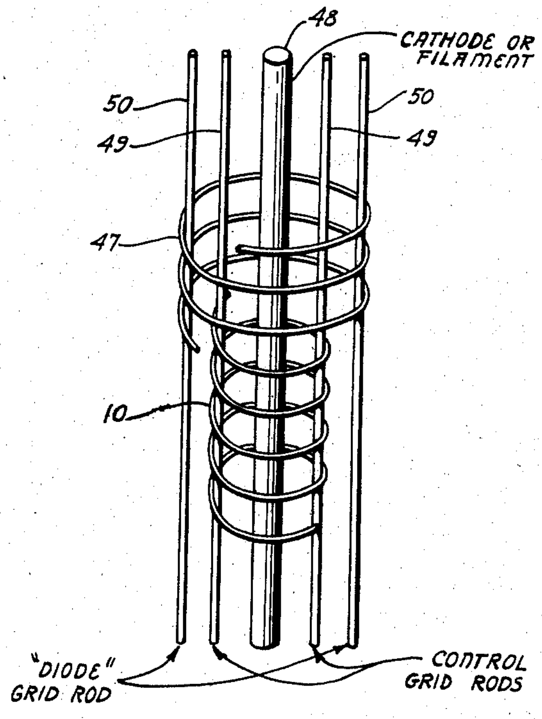
Fig. 5 is a view, in perspective, of a special grid structure applicable to the tube shown schematically in Fig. 4.

A simple and practical way to mount the grids 10 and 47 is illustrated in Fig. 5 where the cylindrical body 48 represents the tube's cathode or filament, the rods 49 are provided to support the control grid 10, and the rods 50 are provided to support the diode grid 47. Preferably the diode grid 47 is short compared to control grid 10.

In operation the circuit arrangement of Fig. 4 differs from that of Fig. 2 only in the action of the diode grid 47. At low and medium signal levels the diode grid 47 functions in essentially the same capacity as the anode 25 of Fig. 2, i. e. as a damper diode to limit automatically the amplitude of the oscillations developed by the oscillator circuit. However as the signal strength is greatly increased, and there is a concomitant increase in the AGC voltage applied to control grid 10, there is a tendency in the circuit of Fig. 2 to reduce, sometimes to an undesirable extent, the amplitude of the generated local oscillation. In some cases this effect may be so extreme that the local oscillator signal becomes smaller than the applied radio frequency signal. The circuit arrangement of Fig. 4 is not subject to this difficulty, for, as the AGC voltage on control grid 10 reaches levels where it would otherwise affect deleteriously the amplitude of the generated oscillation, the diode grid 47 takes over the oscillator function of the control grid 10 and supplies the necessary negative conductance required to sustain a desired level of oscillator amplitude. It will be apparent that, in this arrangement, the control-grid section of the pentode could be completely cut off, and yet the device would continue to oscillate as a pentode oscillator.

Neutralizing is accomplished as in the arrangement of Fig. 2, but in this case the neutralizing capacity may be supplied by the interelectrode capacity present between adjacent grid structures 10—49 and 47—50.

In summary it is to be noted that, by the present invention, there has been provided a new and improved autodyne frequency converter which avoids the limitations thought inherent in the prior art autodyne circuit and which, as compared to the commonly employed pentagrid converter, and as established by comparative tests, provides better noise performance, a notably higher conversion gain, important circuit and tube economies, and a substantially more favorable image-frequency rejection ratio.

Although the invention has been illustrated and described with particular reference to certain specific physical embodiments it will be apparent to those skilled in the art that various alternative arrangements may be employed within the scope of the invention defined in the appended claims.

I claim:

1. An autodyne frequency converter, comprising a vacuum tube having at least a cathode, a control grid and an anode, a grid-cathode circuit for said tube, an anode-cathode circuit for said tube, an oscillatory circuit coupled to both the grid-cathode and anode-cathode circuits to produce a local oscillation in said grid-cathode circuit, means for supplying a signal to said grid-cathode circuit, means for deriving a beat frequency signal from said anode-cathode circuit, said oscillation tending to cause undesirable grid current flow in said grid-cathode circuit, and means for automatically controlling the amplitude of said oscillation and the grid potential so as to preclude grid current flow, said last means comprising a diode connected to control the amplitude of said local oscillation, and a bias resistor in both said grid-cathode and anode-cathode circuits and also in circuit with said diode for biasing both said diode and said grid according to the current in said anode-cathode circuit so as to controllably limit the amplitude of said oscillation and to preclude the flow of grid current.

2. An autodyne frequency converter, comprising a vacuum tube having at least a cathode, a control grid and an anode, a grid-cathode circuit for said tube, an anode-cathode circuit for said tube, an oscillatory circuit coupled to both the grid-cathode and anode-cathode circuits to produce a local oscillation in said grid-cathode circuit, means for supplying a signal to said grid-cathode circuit, means for deriving a beat frequency signal from said anode-cathode circuit, means responsive to said beat frequency signal for developing an automatic gain control voltage, means for supplying said voltage to said grid-cathode circuit to control the conversion gain of the converter, said oscillation tending to counteract the controlling effect of said voltage and also tending to cause undesirable grid current flow, and means for automatically controlling the amplitude of said oscillation and the grid potential so as to overcome the adverse tendencies of said oscillation, said last means comprising a diode connected to control the amplitude of said local oscillation, and a bias resistor in both said grid-cathode and anode-cathode circuits and also in circuit with said diode for biasing both said diode and said grid according to the current in said anode-cathode circuit so as to controllably limit the amplitude of said oscillation and to preclude the flow of grid current.

3. An autodyne frequency converter, comprising a vacuum tube having at least a cathode, a control grid and an anode, a grid-cathode circuit for said tube, an anode-cathode circuit for said tube, an oscillatory circuit connected in said anode-cathode circuit and coupled to said grid-cathode circuit through inductively coupled windings to produce a local oscillation in said grid-cathode circuit, means for supplying a signal to said grid-cathode circuit, means for deriving a beat frequency signal from said anode-cathode circuit, said oscillation tending to cause undesirable grid current flow in said grid-cathode circuit, and means for automatically controlling the amplitude of said oscillation and the grid potential so as to preclude grid current flow, said last means comprising a diode coupled in shunt with said oscillatory circuit through the agency of said inductively coupled windings to control the amplitude of said local oscillation, and a bias resistor in both said grid-cathode and anode-cathode circuits and also in circuit with said diode for biasing both said diode and said grid according to the current in said anode-cathode circuit so as to controllably limit the amplitude of said oscillation and to preclude the flow of grid current, the turns ratio of said inductively coupled windings and the value of said resistor being so chosen that said cathode never falls below zero potential, whereby to effect stabilization of the amplitude of said oscillation.

4. An autodyne frequency converter, comprising a vacuum tube having at least a cathode, a control grid and an anode, a grid-cathode circuit for said tube, an anode-cathode circuit for said tube, an oscillatory circuit connected in said anode-cathode circuit and coupled to said grid-cathode circuit through inductively coupled windings to produce a local oscillation in said grid-cathode circuit, means for supplying a signal to said grid-cathode circuit, means for deriving a beat frequency signal from said anode-cathode circuit, means responsive to said beat frequency signal for developing an automatic gain control voltage, means for supplying said voltage to said grid-cathode circuit to control the conversion gain of the converter, said oscillation tending to counteract the controlling effect of said voltage and also tending to cause undesirable grid current flow, and means for automatically controlling the amplitude of said oscillation and the grid potential so as to overcome the adverse tendencies of said oscillation, said last means comprising a diode coupled in shunt with said oscillatory circuit through the agency of said inductively coupled windings to control the amplitude of said local oscillation, and a bias resistor in both said grid-cathode and anode-cathode circuits and also in circuit with said diode for biasing both said diode and said grid according to the current in said anode-cathode circuit so as to controllably limit the amplitude of said oscillation and to preclude the flow of grid current, the turns ratio of said inductively coupled windings and the value of said resistor being so chosen that said cathode never falls below zero potential, whereby to effect stabilization of the amplitude of said oscillation.

References Cited in the file of this patent

UNITED STATES PATENTS

| | | |
|---|---|---|
| 2,059,587 | Klotz et al. | Nov. 3, 1936 |
| 2,201,770 | Granqvist | May 21, 1940 |
| 2,427,491 | Blumlein | Sept. 16, 1947 |

FOREIGN PATENTS

| | | |
|---|---|---|
| 421,644 | Great Britain | Dec. 21, 1934 |